United States Patent
Park et al.

(10) Patent No.: US 7,601,630 B2
(45) Date of Patent: Oct. 13, 2009

(54) SEMICONDUCTOR DEVICE AND METHOD FOR FABRICATING THE SAME

(75) Inventors: Je-Min Park, Gyeonggi-do (KR); Dong-Won Shin, Gyeonggi-do (KR); Yoo-Sang Hwang, Gyeonggi-do (KR)

(73) Assignee: Samsung Electronics Co., Ltd., Suwon-si, Gyeonggi-do (KR)

(*) Notice: Subject to any disclaimer, the term of this patent is extended or adjusted under 35 U.S.C. 154(b) by 262 days.

(21) Appl. No.: 11/020,827

(22) Filed: Dec. 22, 2004

(65) Prior Publication Data
US 2005/0142756 A1 Jun. 30, 2005

(30) Foreign Application Priority Data
Dec. 26, 2003 (KR) ........................ 10-2003-0097141

(51) Int. Cl.
*H01L 21/4763* (2006.01)
*H01L 21/8239* (2006.01)
*H01L 21/8242* (2006.01)

(52) U.S. Cl. ............... 438/620; 438/238; 438/618; 438/629; 438/637; 257/296; 257/773; 257/E27.084; 257/E27.097; 257/E21.645; 257/E21.646; 257/E21.656; 257/E21.66

(58) Field of Classification Search .......... None
See application file for complete search history.

(56) References Cited

U.S. PATENT DOCUMENTS

| | | | | |
|---|---|---|---|---|
| 5,442,236 A * | 8/1995 | Fukazawa | ................. | 257/758 |
| 5,895,239 A | 4/1999 | Jeng et al. | ................. | 438/239 |
| 5,918,120 A | 6/1999 | Huang | ................. | 438/239 |
| 6,022,776 A | 2/2000 | Lien et al. | ................. | 438/253 |
| 6,285,053 B1 * | 9/2001 | Park | ................. | 257/306 |
| 6,350,649 B1 | 2/2002 | Jeong et al. | ................. | 438/256 |
| 6,518,671 B1 | 2/2003 | Yang et al. | ................. | 257/758 |
| 2002/0105088 A1 | 8/2002 | Yang et al. | ................. | 257/774 |
| 2003/0015732 A1 * | 1/2003 | Park | ................. | 257/200 |
| 2003/0127705 A1 | 7/2003 | Kwak et al. | ................. | 257/536 |
| 2003/0235946 A1 * | 12/2003 | Lee et al. | ................. | 438/243 |

FOREIGN PATENT DOCUMENTS

KR 10-2002-0096093 12/2002

OTHER PUBLICATIONS

English language abstract of Korean Publication No. 10-2002-0096093.

* cited by examiner

*Primary Examiner*—Andy Huynh
*Assistant Examiner*—Hoang-Quan T Ho
(74) *Attorney, Agent, or Firm*—Marger Johnson & McCollom, P.C.

(57) ABSTRACT

A method of fabricating a semiconductor memory device and a structure that forms both a resistor and an etching protection layer to reduce a contact resistance. The method of fabricating a semiconductor memory device according to the invention includes forming an insulation layer on a semiconductor substrate having a cell array region, a core region, and a peripheral region, each having at least one transistor formed therein, and forming both a first landing pad in the core region on the insulation layer and a second landing pad in the peripheral region, the first landing pad being overlapped with a part of a first conductive line. The invention reduces the contact resistance and prevents or minimizes a device failure caused by a misalignment, with the simplified process.

9 Claims, 9 Drawing Sheets

SEMICONDUCTOR DEVICE AND METHOD FOR FABRICATING THE SAME

CROSS-REFERENCE TO RELATED APPLICATION

This application claims the benefit of Korean Patent Application No. 2003-0097141, filed on Dec. 26, 2003, the disclosure of which is incorporated herein by reference in its entirety.

BACKGROUND OF THE INVENTION

1. The Field of the Invention

This invention relates to a semiconductor device and a method for fabricating the same. More particularly, this invention relates to a method for fabricating a semiconductor device and a structure capable of contributing to the simplification of the process, minimizing a failure of the metal contact and reducing the contact resistance.

2. Description of the Related Art

A semiconductor memory device such as a DRAM device is divided into a memory cell array region, a core region, and a peripheral region.

The memory cell array region includes a plurality of word lines, a plurality of bit lines, and a plurality of memory cells, i.e., memory elements arranged in an area intersected by the lines. The memory cells are driven by selection of the word lines and the bit lines.

The core and peripheral regions include a circuit area formed on the periphery of the memory cell array region for driving and controlling the memory cells. The core and peripheral regions have different elements such as diodes, resistors, and transistors for driving the memory cells. Mostly, conductive layers or transistors are used as the resistors. Conventionally, a polysilicon gate has been used for the resistor by way of a metal contact or a bit line contact. In an attempt to reduce the resistance of the gate, a polycide gate comprised of polysilicon and metal silicide is substituted for the polysilicon gate. But the polycide gate is not suitable for resistors because its use results in a low unit area resistance of the gate. Currently, polysilicon is used to form resistors.

In general, the conventional polysilicon resistors are formed together with plate nodes or storage nodes in a step of forming a capacitor of the cell region. Namely, the resistors are formed by deposition of a physical layer constituting the storage nodes, such as a polysilicon layer extending to the peripheral region as well as the cell region and then patterning of the deposited physical layer, when forming the nodes constituting the capacitor.

Such a method of forming a resistor together with a storage node is disclosed in U.S. Patent Publication No. 2003/0127705, entitled "Semiconductor memory device having resistor and method of fabricating the same".

On the other hand, the general semiconductor device has a multi-layer interconnection structure so as to utilize the surface area of the integrated circuits more efficiently. In the multi-layer interconnection structure, active elements and interconnects are formed in integration with each other, and the individual layers are connected by way of interlayer connections such as contact plugs or studs. Meanwhile, landing pads are formed on the studs or the contact plugs so as to support the alignment of the contact plugs and to lower the contact resistance. The landing pads are generally larger in surface area than circuitries or metal lines A method for supporting alignment and reducing a contact resistance using landing pads is disclosed in U.S. Patent Publication No. 2003/0015732, which claims the priority from Korean Patent No. 10-0385960, entitled "Integrated circuits having self-aligned metal contact structure and method of fabricating the same." With a growing trend towards higher integration, the distance between the patterns becomes small enough to easily cause a short with adjacent conductive patterns. Particularly, bit lines are sometimes used as local interconnects in the core region in which sense amplifiers are formed. In this region, the circuit patterns are arranged very densely, making it difficult to secure a distance from the patterns and causing an increase in the contact resistance even with the formation of a contact.

Figure 1:
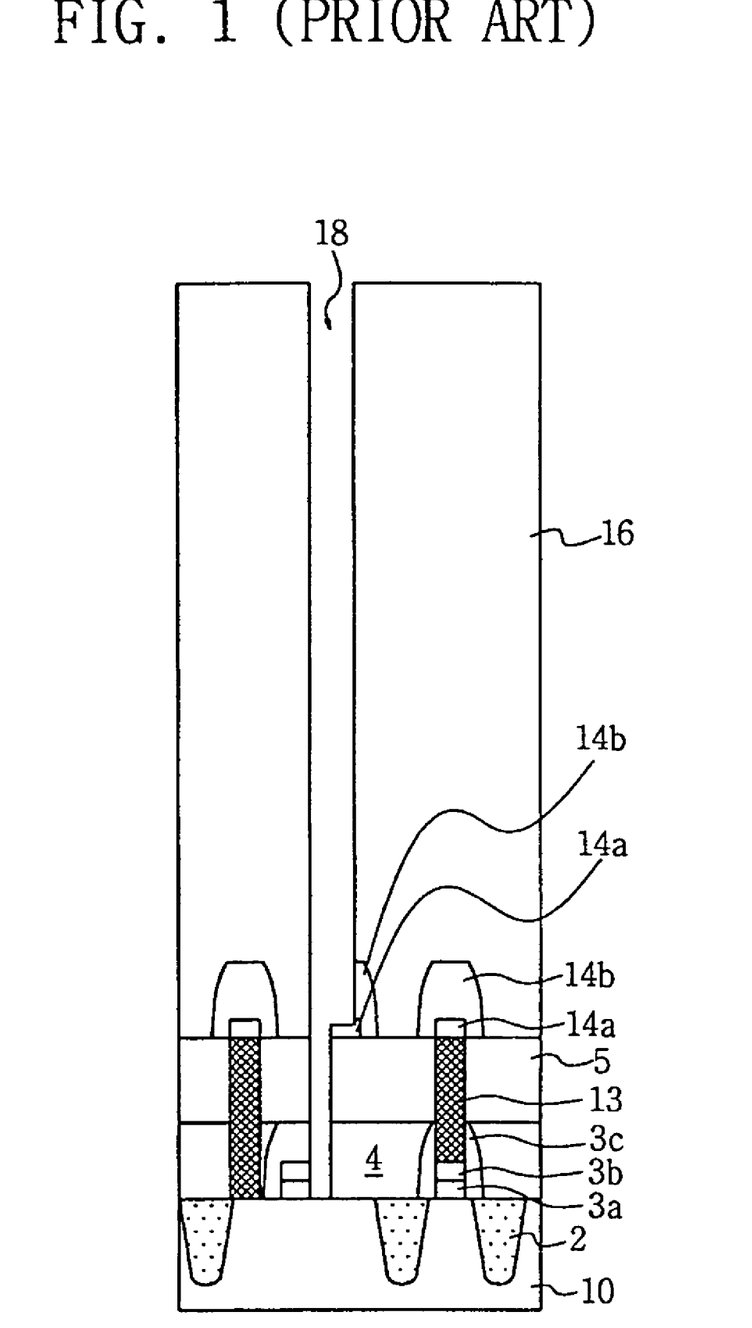
FIG. 1 is a cross-section showing a contact hole formed in the case of a misalignment in the core region according to the prior art.
Figure 2:
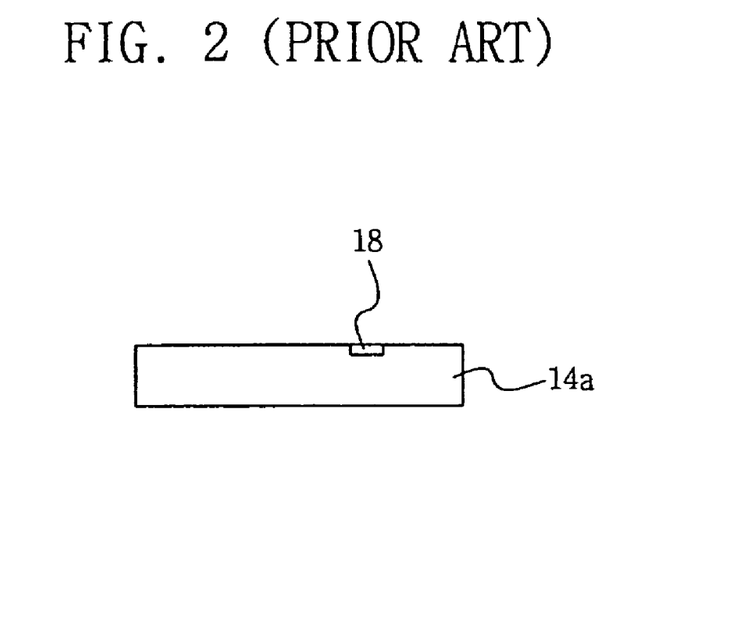
FIG. 2 is a plan view of FIG. 1.

FIG. 1 is a cross-section showing that a contact for the self-aligned metal lines is formed in the core region, and FIG. 2 is a plan view showing the formation of the contact.

As illustrated in FIGS. 1 and 2, a gate oxide layer 3a and a gate electrode 3b covered by a gate capping layer 3c are formed on a first insulation layer 4 on a semiconductor substrate 10 in which a device isolation layer 2 is formed. On a second insulation layer 5 formed on the first insulation layer 4, there are formed metal lines 14a corresponding to the bit lines in the cell array region and a metal line capping layer 14b corresponding to the bit lines. The metal lines 14a corresponding to the bit lines are connected to the transistors, which are formed below the metal lines 14a, through contacts or studs 13.

A third insulation layer 16 is formed on the metal lines 14a corresponding to the bit lines, and a contact hole 18 to connect to the upper metal lines is formed. Here, the contact hole 18 is misaligned, in which case it extends below the metal lines 14a, which correspond to the bit lines, to cause damage to the lower structure. This is because the overlap margin in the core region disappears with a decrease in the design rules, causing a device failure. Such damage to the lower structure that causes a failure may occur when forming the contact hole of a larger size besides misalignment. In an attempt to solve this problem, the design rules in the core region are increased, in which case, unfortunately, the chip is increased in size to reduce the number of chips available on one wafer, resulting in an increase in the manufacturing costs.

SUMMARY OF THE INVENTION

In one embodiment, a method for fabricating a semiconductor memory device is provided. The method includes forming an insulation layer on a semiconductor substrate having a cell array region, a core region, and a peripheral region, each having at least one transistor formed thereon; forming a first landing pad on the insulation layer in the core region and a second landing pad in the peripheral region on the insulation layer; and forming first conductive lines overlying the first landing pad in the core region and a second conductive line overlying the second landing pad in the peripheral region. Preferably, the first landing pad is overlapped with a portion of one of the first conductive lines when viewed in plan view and spaced apart from a first contact connecting the other one of the first conductive lines with the at least one transistor, and the second landing pad is connected to the second conductive line through a second contact.

In one aspect of the invention, there is provided a method of fabricating a semiconductor memory device that includes: forming an insulation layer on a semiconductor substrate having a cell array region, a core region, and a peripheral region, each having at least one transistor formed therein; and forming both a first landing pad in the core region on the insulation layer and a second landing pad in the peripheral region, the first landing pad being overlapped with a part of a first conductive line formed thereon in a subsequent step and spaced apart from a contact connecting the first conductive line and the lower transistor, the second landing pad being connected to a second conductive line formed thereon in the subsequent step through the contact.

The first landing pad is larger in width than the first conductive line formed thereon. The first landing pad is used as an etch stop layer in forming a contact hole for formation of a contact connected to the first conductive line. The second landing pad is used as a resistor. The first and second landing pads are formed from a polysilicon material.

In another aspect of the present invention, there is provided a method of fabricating a semiconductor memory device that includes: forming a first insulation layer on a semiconductor substrate and then a conductive pad, the semiconductor substrate defining a cell array region, a core region, and a peripheral region, each having at least one transistor formed therein, the conductive pad being connected to the transistor in the cell array region; forming a second insulation layer on the entire surface of the semiconductor substrate having the conductive pad formed thereon, and forming both a first landing pad in the core region and a second landing pad in the peripheral region by photolithography and etching; and forming a third insulation layer on the semiconductor substrate having the first and second landing pads formed thereon, and forming both a bit line and a metal line, the bit line being connected to the conductive pad in the cell array region through the third and second insulation layers, the metal line corresponding to the bit line connected to the transistors in the core and peripheral regions through the third, second and first insulation layers.

A part of the metal line corresponding to the bit line formed in the core region overlaps the top surface of the first landing pad. The metal line corresponding to the at least one bit line formed in the peripheral region is connected to the second landing pad.

In still another aspect of the invention, there is provided a method of fabricating a semiconductor memory device that includes: forming transistors having a source, a drain, and a gate in a semiconductor substrate having a cell array region, a core region, and a peripheral region defined therein; forming a first insulation layer on the entire surface of the semiconductor substrate having the transistors formed therein; forming a conductive pad for a bit line connected to the drain or the source of at least one of the transistors in the cell array region; forming a second insulation layer on the entire surface of the semiconductor substrate having the conductive pad formed thereon, and forming both a resistor comprised of a polysilicon material in the peripheral region and an etching protection layer comprised of the same material of the resistor in the core region by photolithography and etching; forming a third insulation layer on substantially the entire surface of the semiconductor substrate having the resistor and the etching protection layer formed thereon; simultaneously forming a bit line connected to the conductive pad through the third and second insulation layers in the cell array region, a metal line corresponding to the bit line connected to the at least one lower transistor in the core region, and a metal line connected to the resistor in the peripheral region; forming a fourth insulation layer on the entire surface of the semiconductor substrate having the bit line and the metal line formed thereon; and forming an opening for formation of a capacitor in the cell array region having the fourth insulation layer formed therein, and a contact hole for formation of a metal contact connected to the bit line formed on the first landing pad in the core region.

In still another aspect of the invention, there is provided a structure of a semiconductor memory device that includes: a semiconductor substrate having a cell array region, a core region, and a peripheral region, each having at least one transistor formed therein; a first landing pad positioned inside an insulation layer formed on the semiconductor substrate of the core region, being overlapped with a part of a first conductive line formed thereon in a subsequent step, and spaced apart from a contact connecting the first conductive line and the lower transistor; and a second landing pad positioned inside an insulation layer formed on the semiconductor substrate of the peripheral region, connected to a second conductive line formed thereon in a subsequent step through a contact, and having the same height as the first landing pad.

The first and second conductive lines are metal lines corresponding to the bit line formed in the cell array region. The first and second landing pads are formed from a conductive material. The first landing pad is an etching protection layer. The second landing pad is used as a resistor.

According to the method and the structure, a device failure caused by a misalignment can be prevented or minimized, with the simplified process.

DETAILED DESCRIPTION OF THE PREFERRED EMBODIMENTS

Hereinafter, the embodiments of the present invention will be described in detail with reference to the attached drawings. However, the embodiments of the present invention have many variations. The scope of the present invention is not restricted to the following embodiments. The same elements are denoted by the same reference numerals throughout the drawings.

In the cell array region of FIGS. 3 to 7, cross-sectional views are shown in the direction of word lines on the left side and in the direction of bit lines on the right side.

Figure 3:
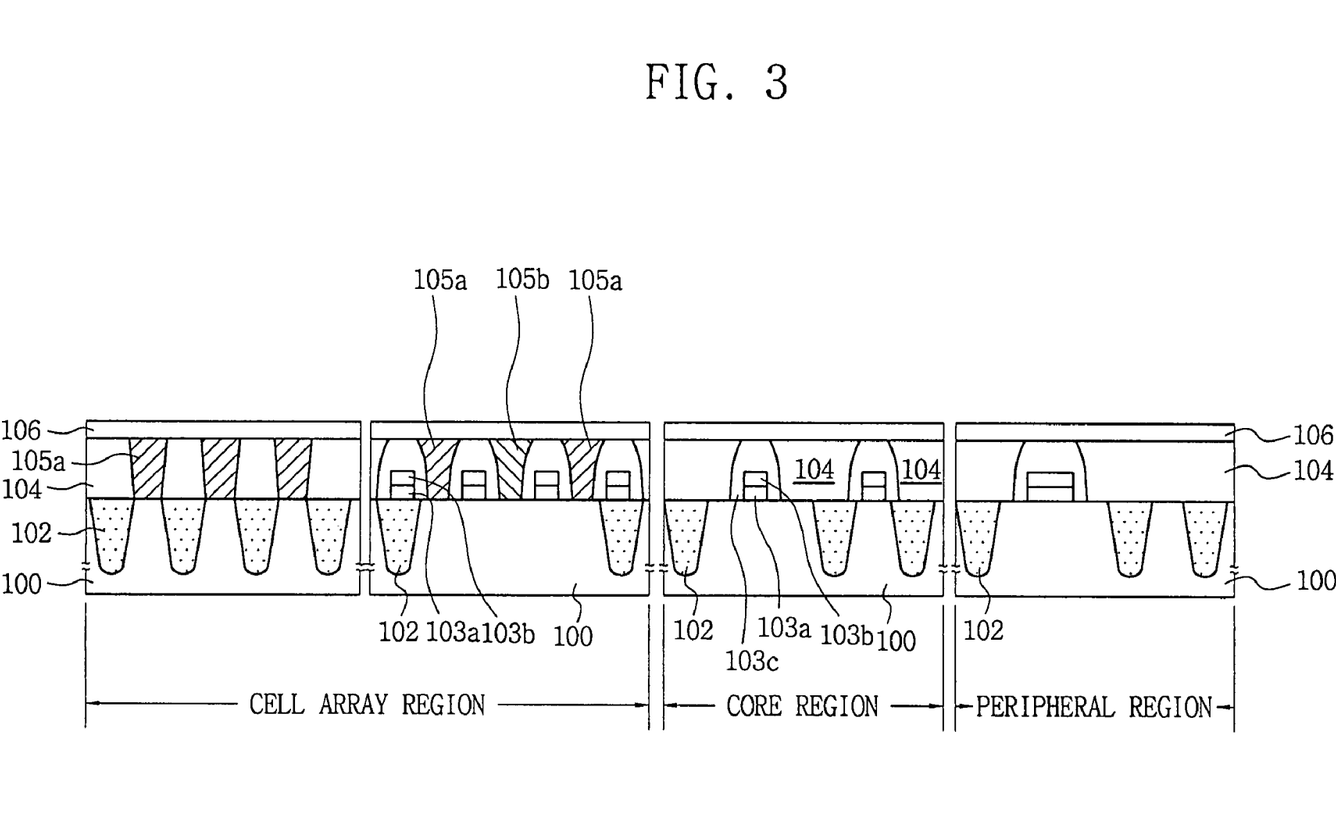
FIGS. 3 to 9 are cross-sectional views sequentially showing a process of fabricating a semiconductor memory device according to an embodiment of the present invention.

Referring to FIG. 3, a field isolation layer 102 is formed to define a plurality of active regions in a semiconductor substrate 100 including a cell array region, a core region, and a peripheral region. A gate dielectric layer 103a is formed on a portion of the active regions. A gate electrode 103b and a gate capping layer 103c are formed on the resulting structure including the gate dielectric layer 103a. Impurity ions are injected into the active regions using the field isolation layer 102 and the gate capping layer 103c as an ion implantation mask to form high-concentration impurity regions. The impurity regions formed on the individual active regions represent a source region and a drain region. Subsequently, a first insulation layer 104 is formed on the resulting structure including the gate electrode 103b and the gate capping layer 103c.

In the cell array region, a bit line pad 105b connected to the drain region and a storage node contact pad 105a connected to the source region are formed in the first insulation layer 104 using conventional techniques. Then, a second insulation layer 106 is formed on the first insulation layer 104.

Figure 4:
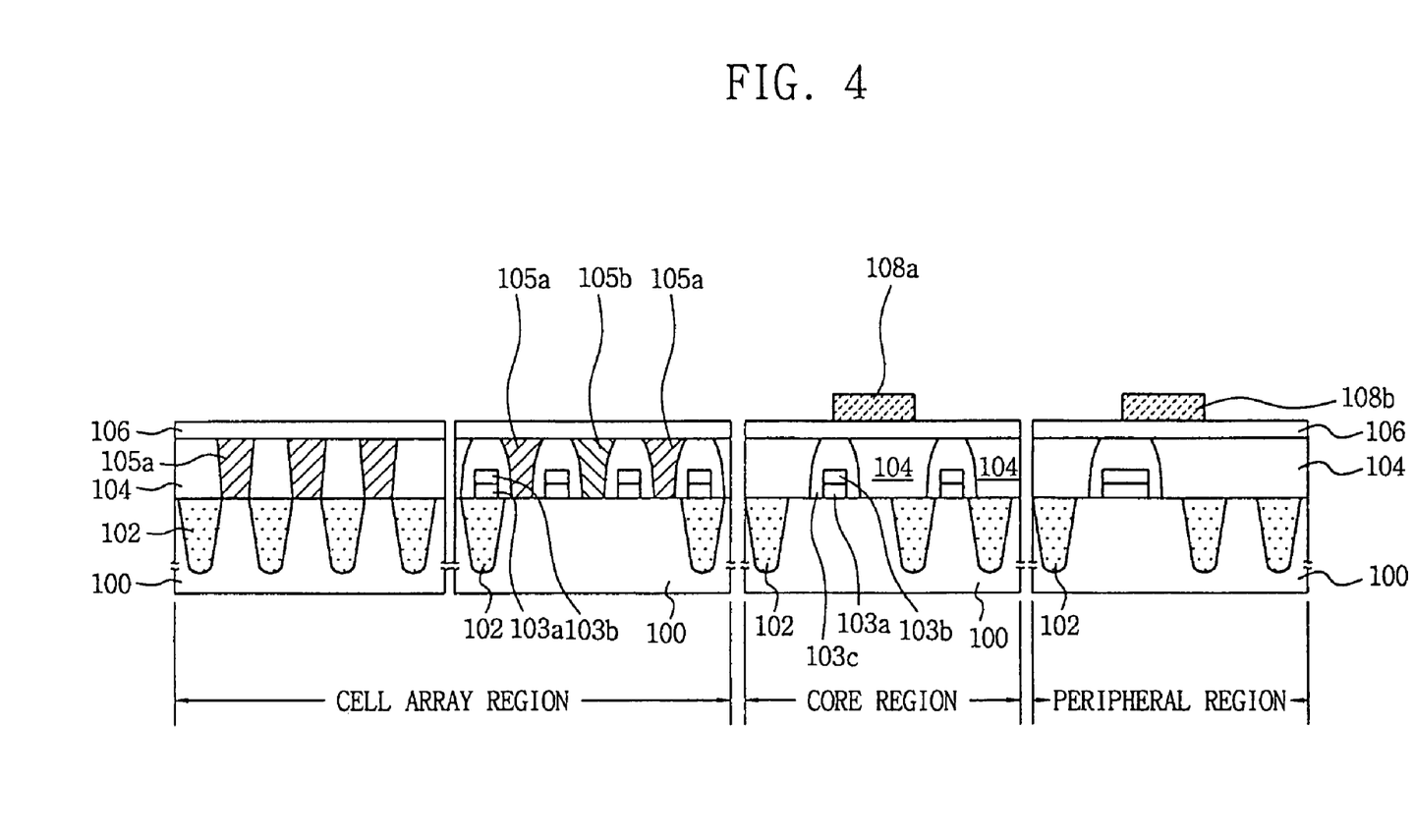

Referring to FIG. 4, a conductive layer is formed on the second insulation layer 106. The conductive layer may be formed using polysilicon by CVD (Chemical Vapor Deposition). The conductive layer is patterned by photolithography and etching to form a first landing pad 108a underneath a region for formation of bit lines in the core region, and a second landing pad 108b in the peripheral region.

The first landing pad 108a serves as an etch stop layer to prevent damage to the lower structure during the etching even when the contact for the upper metal lines connected to the bit lines of the core region is formed of a larger size than the lower metal lines in the subsequent processing step. The second landing pad 108b serves as a resistor in the peripheral region.

Figure 5:
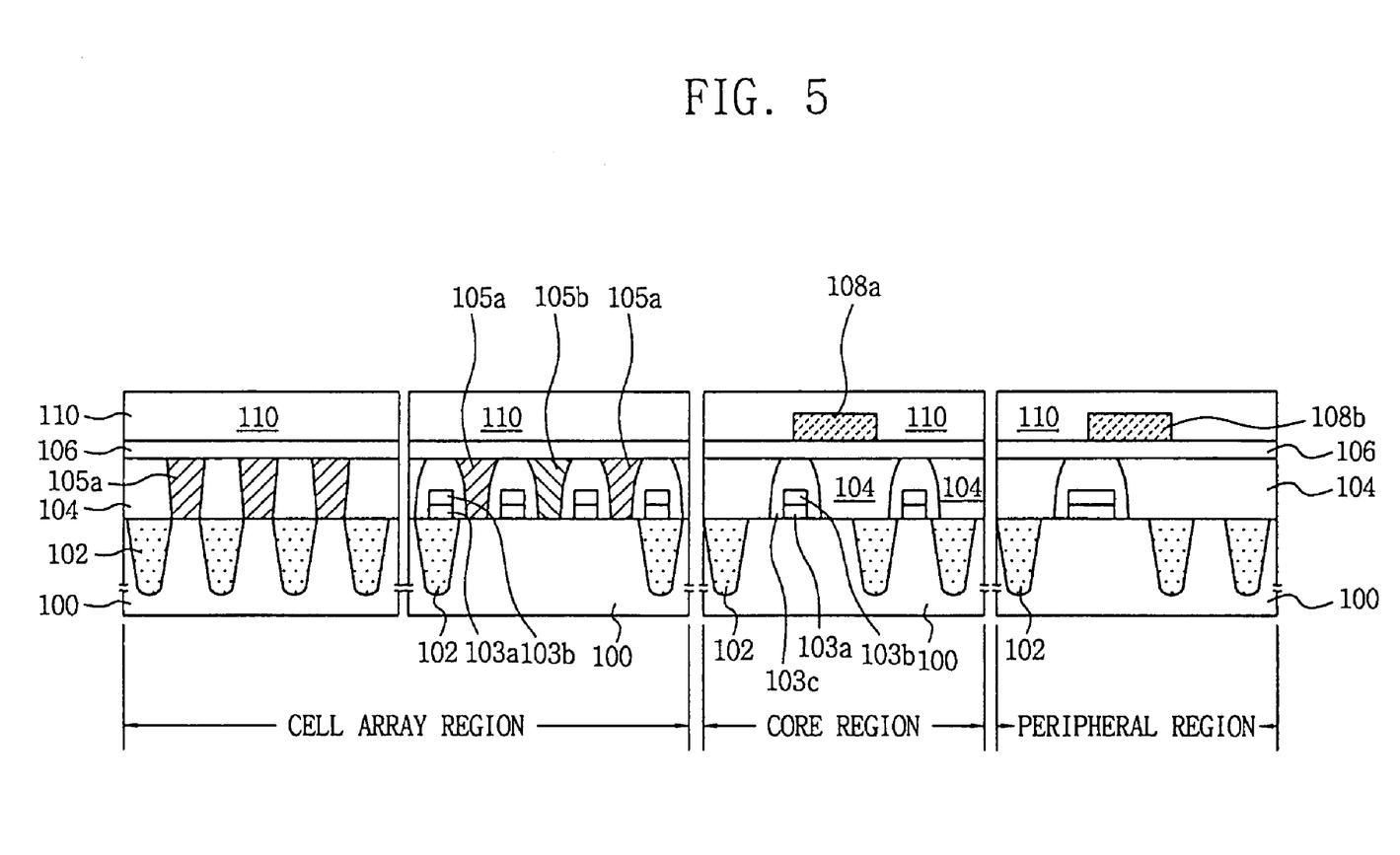

Referring to FIG. 5, a third insulation layer 110 is formed on the resulting structure including the first and second landing pads 108a and 108b.

The third insulation layer 110 may be formed from a flowable material. The third insulation layer 110 may be formed by a conventional thin film deposition method such as CVD and then planarized by a method such as CMP.

Figure 6:
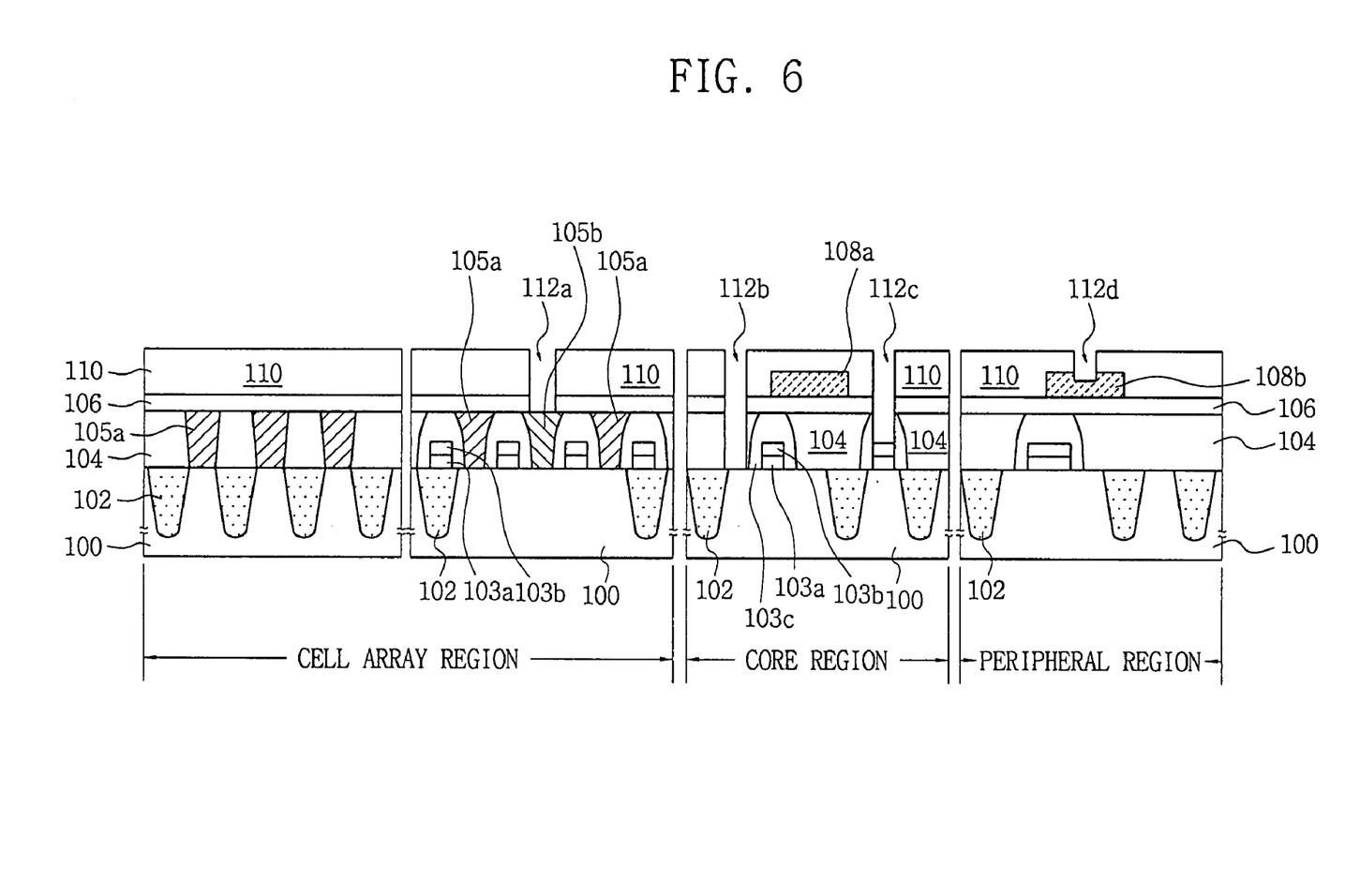

Referring to FIG. 6, a bit line contact hole 112a to be connected to the bit line pad 105b is formed in the cell array region of the semiconductor substrate including the third insulation layer 110 formed thereon. At the same time, contact holes 112b and 112c connected to the lower transistor are formed in the core region. In addition to the contact holes 112a, 112b and 112c, a contact hole 112d to be connected to the second landing pad 108b used as a resistor may be also formed in the peripheral region.

Figure 7:
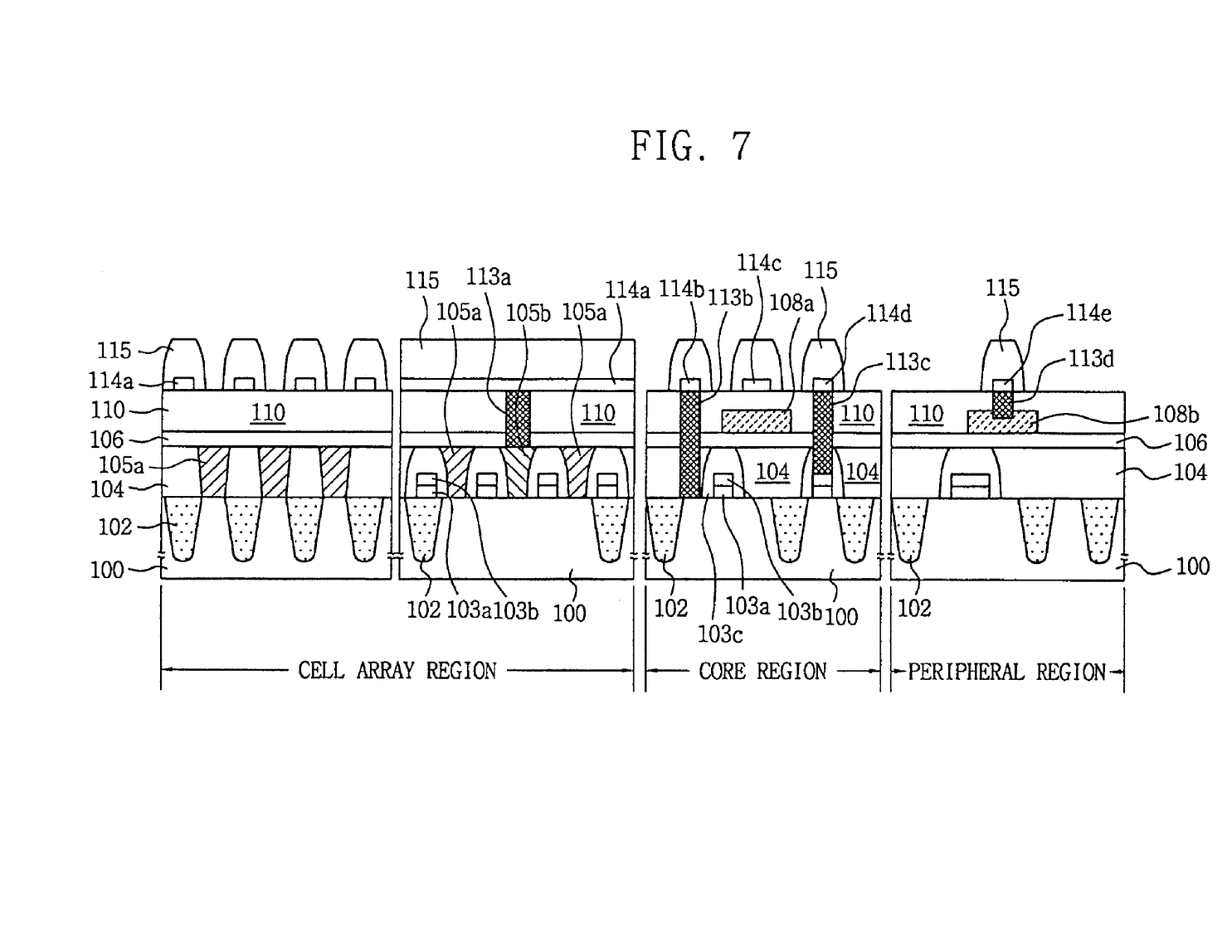

Referring to FIG. 7, contacts 113a, 113b, 113c and 113d are formed within the contact holes 112a, 112b, 112c and 112d. A bit line 114a connected to the bit line contact 113a and a bit line capping layer 115 are formed in the cell array region of the semiconductor substrate 100. At the same time, metal lines 114b, 114c, and 114d corresponding to the bit lines that are first conductive lines connected to the contacts 113b and 113c are formed in the core region. In addition, a metal line 114e corresponding to the bit line that is a second conductive line connected to the contact 113d is formed in the peripheral region.

Regarding the contacts 113a, 113b, 113c and 113d, the bit line 114a, and the metal lines 114b, 114c, 114d, and 114e of the core and peripheral regions, preferably, the metal lines 114a, 114b, 114c, 114d and 114e are not formed subsequent to the contacts 113a, 113b, 113c and 113d but together with the contacts in a single step by deposition and patterning of a same conductive material.

The bit line 114a and the metal lines 114b, 114c, 114d and 114e of the core and peripheral regions are formed of a conductive material and surrounded by the capping layer 115. The capping layer 115 may comprise a nitride (SiN) film.

Figure 8:
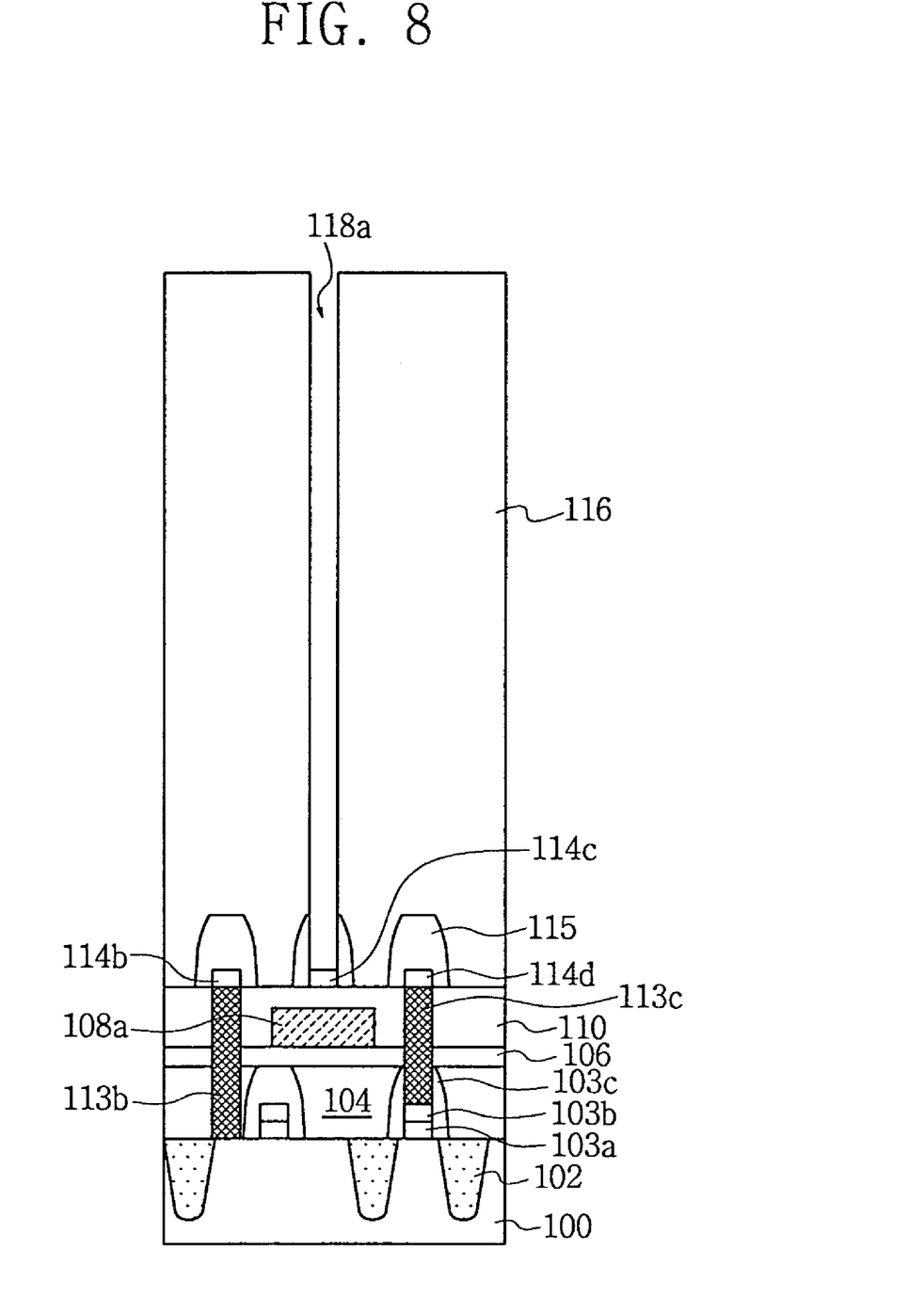
Figure 9:
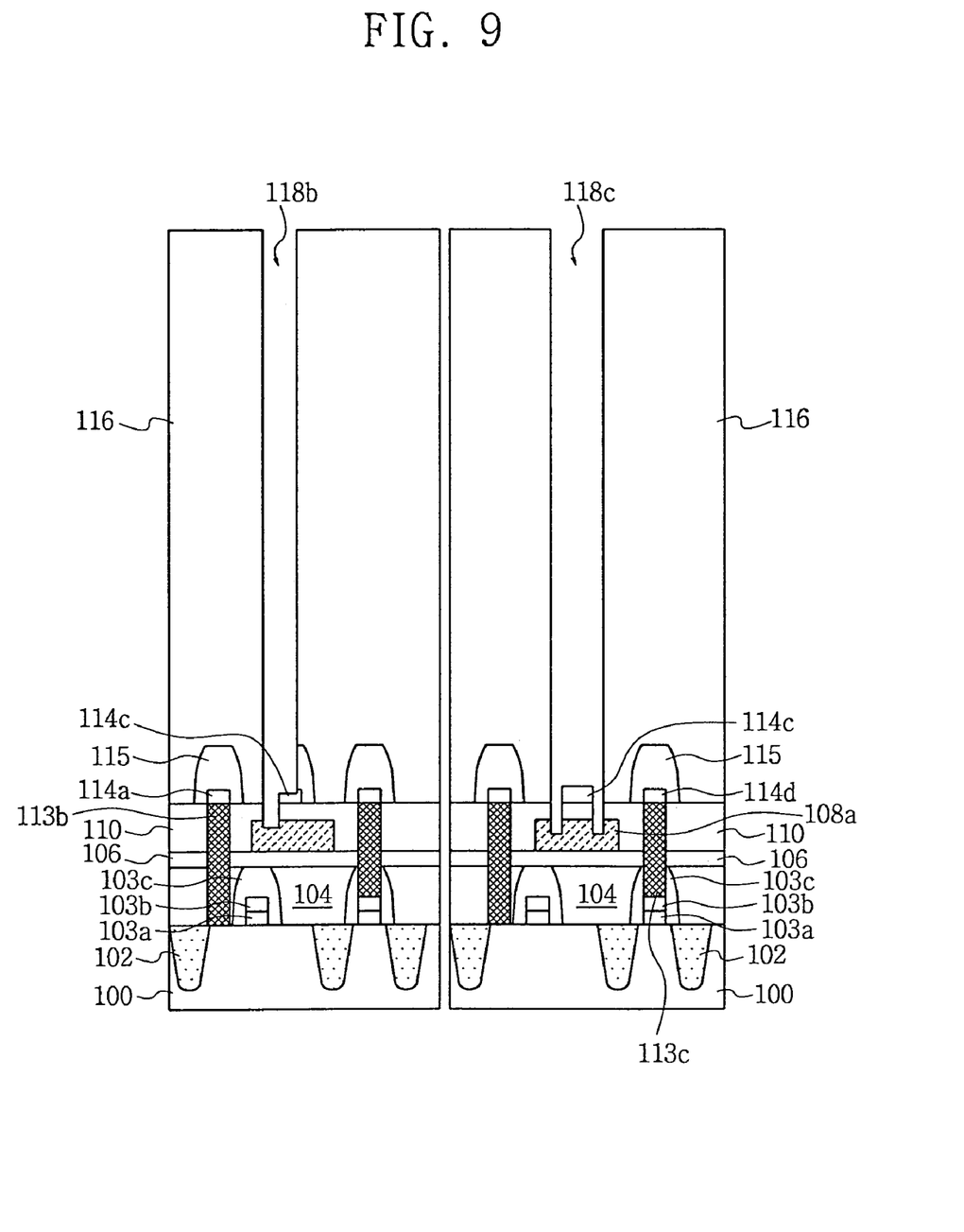

FIGS. 8 and 9 are cross-sectional views showing contact holes 118a, 118b, and 118c for forming contacts connecting the metal line 114d corresponding to the bit line in the core region and an upper metal line (not shown).

Referring to FIG. 8, a fourth insulation layer 116 is thickly formed on the semiconductor substrate 100 including the metal lines 114b, 114c, and 114d corresponding to the bit lines in the core region. In the case of a DRAM, the fourth insulation layer 116 is formed for contacts used to form a capacitor in both the cell array region and the core region.

The fourth insulation layer 116 in the core region is used for forming contacts to connect the metal lines 114b, 114c, and 114d corresponding to the bit lines with an upper metal line formed in the fourth insulation layer 116.

A contact hole 118a exposing the metal line 114c corresponding to the bit line is formed in the fourth insulation layer 116 by photolithography and etching.

Figure 10:
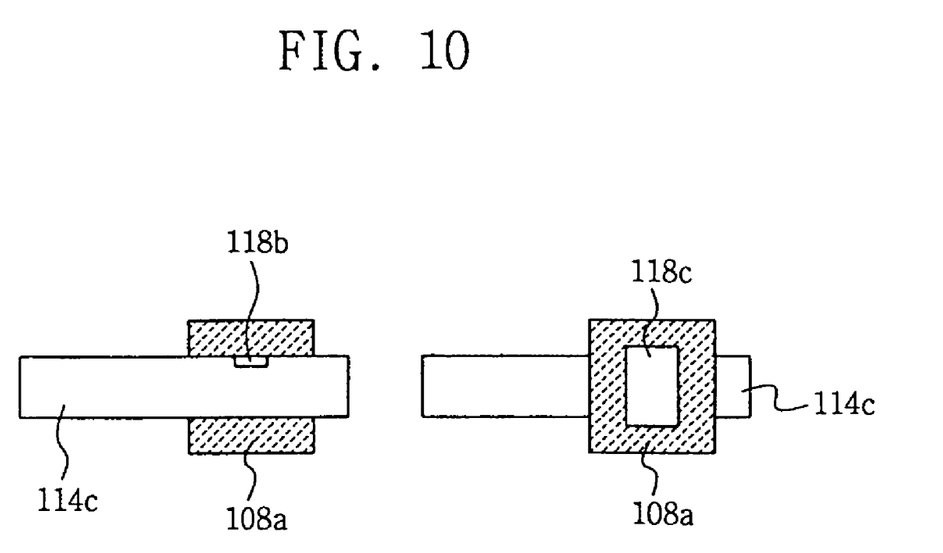
FIG. 10 is a plan view showing a contact hole formed in the case of a misalignment in the core region and a contact hole formed in a larger size according to an embodiment of the present invention.

FIG. 9 is a cross-sectional showing different structures of the contact holes of FIG. 8, and FIG. 10 is a plan view of FIG. 9.

Referring to FIGS. 9 and 10, the left-hand cross-sectional view shows a misalignment, and the right-handed cross-sectional view shows the contact hole 118c formed of a larger size than the metal line 114c corresponding to the bit line.

As illustrated in the left-hand cross-sectional view, the first landing pad 108a used as an etching protection layer can protect the lower structure even when a misalignment occurs during the formation of the contact hole 118b. In the right-hand cross-sectional view, etch damage to the lower structure can be avoided or minimized even though the contact hole 118c is larger in width than the metal line 114c corresponding to the bit line. Accordingly, the contact can be formed of a larger size to reduce the contact resistance.

It should be apparent to those skilled in the art that the method of fabricating a semiconductor memory device having a resistor and an etching protection layer to reduce the contact resistance and a structure therefrom are useful or applicable to the fabrication of DRAMs or other nonvolatile memory devices.

As described above, the present invention forms a first landing pad as an etching protection layer while maintaining the existing design rules, making it possible to form contacts of a larger size to connect an upper metal line with metal lines corresponding to the bit line in the core region, to reduce a contact resistance, and to also avoid or minimize a device failure even though a misalignment occurs during the formation of contact holes with contacts formed in a small size. In addition, the present invention contributes to the simplification of the process by forming an etching protection layer together with a resistor in the peripheral region.

While this invention has been described in connection with what is presently considered to be the most practical and preferred embodiment, it is to be understood that the invention is not limited to the disclosed embodiments, but, on the contrary, is intended to cover various modifications and equivalent arrangements included within the spirit and scope of the appended claims.

What is claimed is:

1. A method for fabricating a semiconductor memory device, the method comprising:
    forming a first insulation layer on a semiconductor substrate having a cell array region, a core region, and a peripheral region, each having at least one transistor formed thereon;
    forming a first landing pad on the first insulation layer in the core region and a second landing pad in the peripheral region on the first insulation layer;
    forming a second insulation layer overlying the first and second landing pads; and
    forming first conductive lines overlying the first landing pad with the second insulation layer interposed therebetween in the core region and a second conductive line overlying the second landing pad in the peripheral region,
    wherein the first landing pad is overlapped with a portion of one of the first conductive lines when viewed in plan view, is spaced apart from a first contact connecting the other one of the first conductive lines with the at least one transistor and is spaced apart from the first conductive lines with the second insulation layer interposed therebetween, and wherein the second landing pad is connected to the second conductive line through a second contact.

2. The method as claimed in claim 1, wherein the first landing pad is larger in width than the one of the first conductive lines overlying the first landing pad.

3. The method as claimed in claim 1, further comprising:
forming an interlayer insulation layer overlying the first landing pad; and
forming a contact hole through the interlayer insulation layer to expose the one of the first conductive lines, using the first landing pad as an etch stop layer.

4. The method as claimed in claim 1, wherein the second landing pad comprises a resistor.

5. The method as claimed in claim 1, wherein the first and second landing pads comprise a polysilicon material.

6. The method as claimed in claim 1, wherein the one of the first conductive lines is electrically insulated from the at least one transistor in the core region.

7. The method as claimed in claim 1, wherein the second conductive line is electrically insulated from the at least one transistor in the peripheral region.

8. The method as claimed in claim 1, wherein the first landing pad is electrically insulated from the at least one transistor in the core region.

9. The method as claimed in claim 8, wherein the second landing pad is electrically insulated from the at least one transistor in the peripheral region.

* * * * *